US010671326B2

(12) United States Patent
Cilfone et al.

(10) Patent No.: US 10,671,326 B2
(45) Date of Patent: Jun. 2, 2020

(54) PEER TO PEER HEALTH MONITORING OF DISPERSED STORAGE UNITS IN A DISTRIBUTED STORAGE NETWORK

(71) Applicant: International Business Machines Corporation, Armonk, NY (US)

(72) Inventors: Bart R. Cilfone, Marina del Rey, CA (US); Alan M. Frazier, Palatine, IL (US); Patrick A. Tamborski, Chicago, IL (US); Sanjaya Kumar, South Elgin, IL (US); Manish Motwani, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 118 days.

(21) Appl. No.: 16/052,126

(22) Filed: Aug. 1, 2018

(65) Prior Publication Data

US 2020/0042382 A1 Feb. 6, 2020

(51) Int. Cl.
*G06F 3/06* (2006.01)
*G06F 11/10* (2006.01)
*G06F 8/65* (2018.01)
*G11C 29/52* (2006.01)
*G06F 11/30* (2006.01)

(52) U.S. Cl.
CPC .............. *G06F 3/067* (2013.01); *G06F 3/064* (2013.01); *G06F 3/0619* (2013.01); *G06F 8/65* (2013.01); *G06F 11/1068* (2013.01); *G06F 11/3055* (2013.01); *G11C 29/52* (2013.01)

(58) Field of Classification Search
CPC .... G06F 3/067; G06F 11/3055; G06F 3/0619; G06F 8/65; G06F 3/064; G06F 11/1068; G11C 29/52
See application file for complete search history.

(56) References Cited

U.S. PATENT DOCUMENTS

| 7,634,595 | B1 * | 12/2009 | Brown | G06F 3/061 710/17 |
|---|---|---|---|---|
| 9,442,671 | B1 | 9/2016 | Zhang et al. | |
| 9,697,219 | B1 * | 7/2017 | Wang | G06F 16/1734 |
| 2008/0147821 | A1 | 6/2008 | Dietrich | |
| 2014/0156832 | A1 | 6/2014 | Stanko et al. | |
| 2020/0012729 | A1 * | 1/2020 | Shaikh | G06F 12/0253 |

OTHER PUBLICATIONS

M. Á. Sipos and P. Ekler, "Predicting Availability of Mobile Peers in Large Peer-to-Peer Networks," 2013 3rd Eastern European Regional Conference on the Engineering of Computer Based Systems, Budapest, 2013, pp. 71-77. (Year: 2013).*

* cited by examiner

*Primary Examiner* — Cynthia Britt
(74) *Attorney, Agent, or Firm* — James Nock; Andrew D. Wright; Roberts Calderon Safran & Cole, P.C.

(57) ABSTRACT

A storage unit (SU) in a dispersed storage network (DSN) coordinates with affiliated dispersed storage units (SUs) to designate a leader SU among the plurality of SUs and when the SU is designated the leader, receives management information that is associated with the affiliated SUs from at least some of the affiliated SUs. The SU processes the management information from the at least some of the affiliated SUs to determine whether at least one of the affiliated SUs is offline; and based on a determination that the at least one of the SUs of the affiliated SUs is offline, transmits the management information for the affiliated SUs to one or more administrators associated with the DSN.

20 Claims, 8 Drawing Sheets

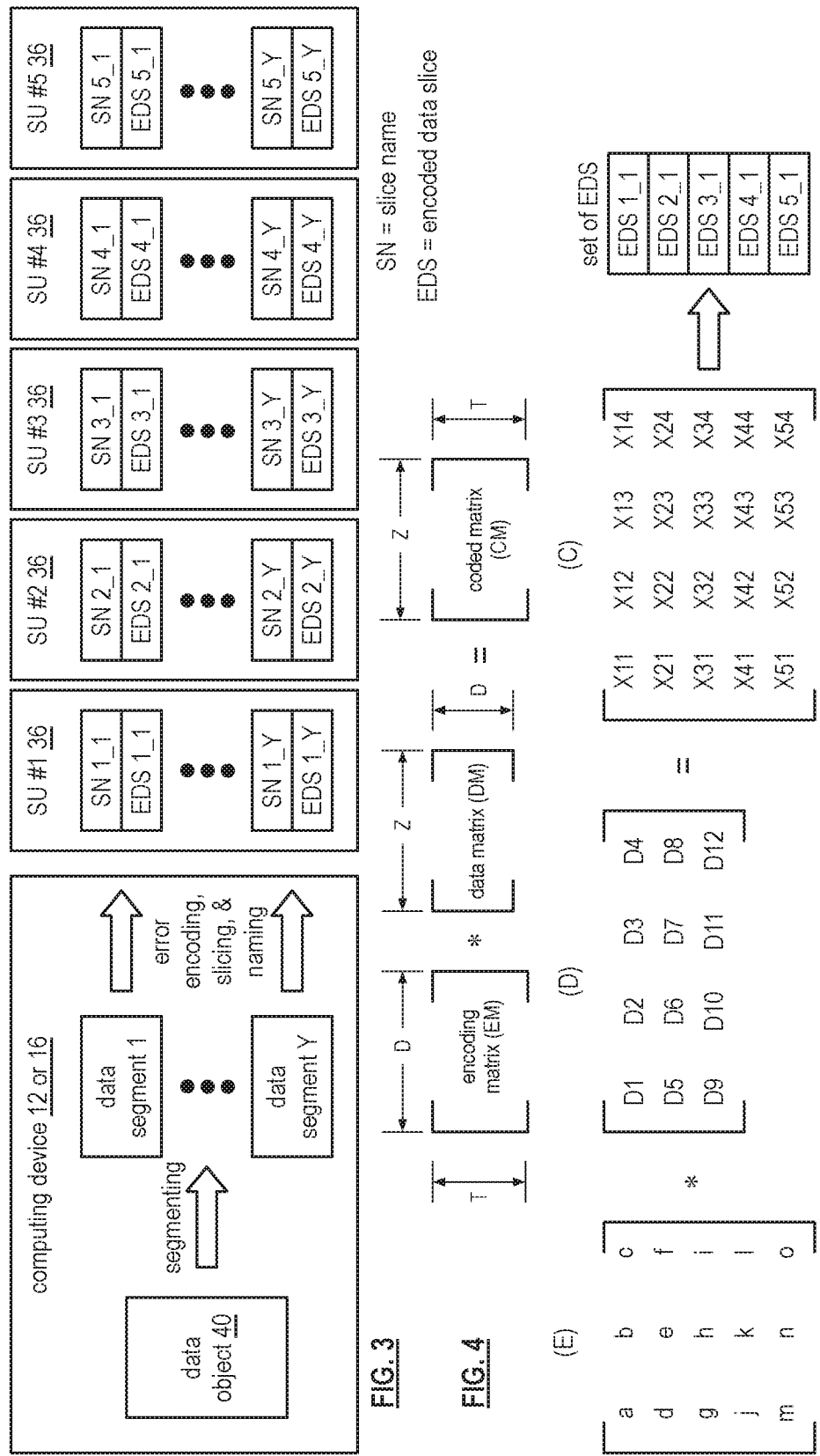

PEER TO PEER HEALTH MONITORING OF DISPERSED STORAGE UNITS IN A DISTRIBUTED STORAGE NETWORK

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Cloud storage systems may use dispersed storage units provisioned in various configurations to store data, along with management units to monitor the health of the dispersed storage units and provide notifications to system administrators. Management units may be standalone devices, however when the management units themselves are offline or otherwise compromised critical management functions may not be available.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
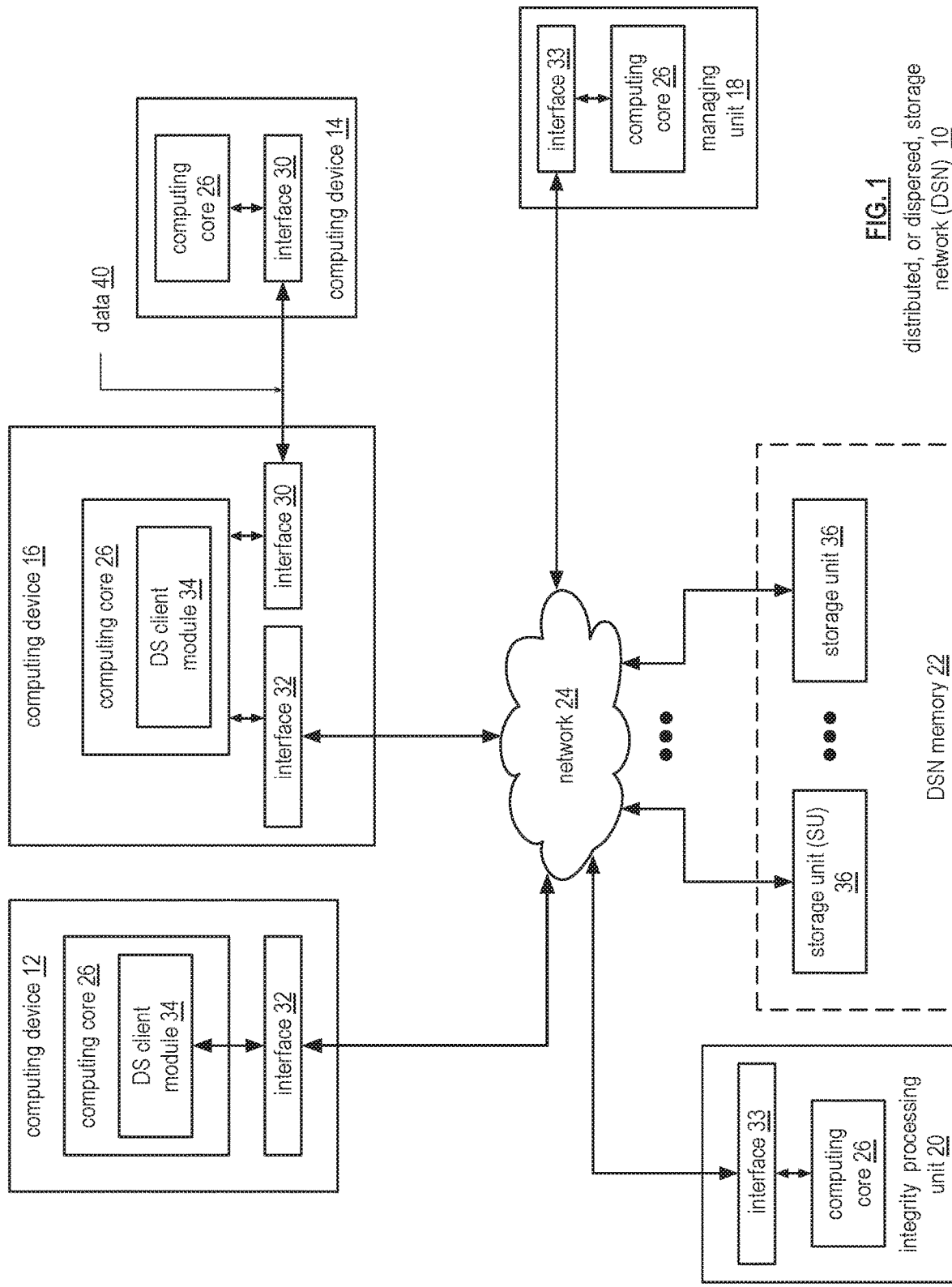
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems, one or more non-public intranet systems and/or public internet systems; and/or one or more local area networks (LAN) and/or wide area networks (WAN).

Figure 2:
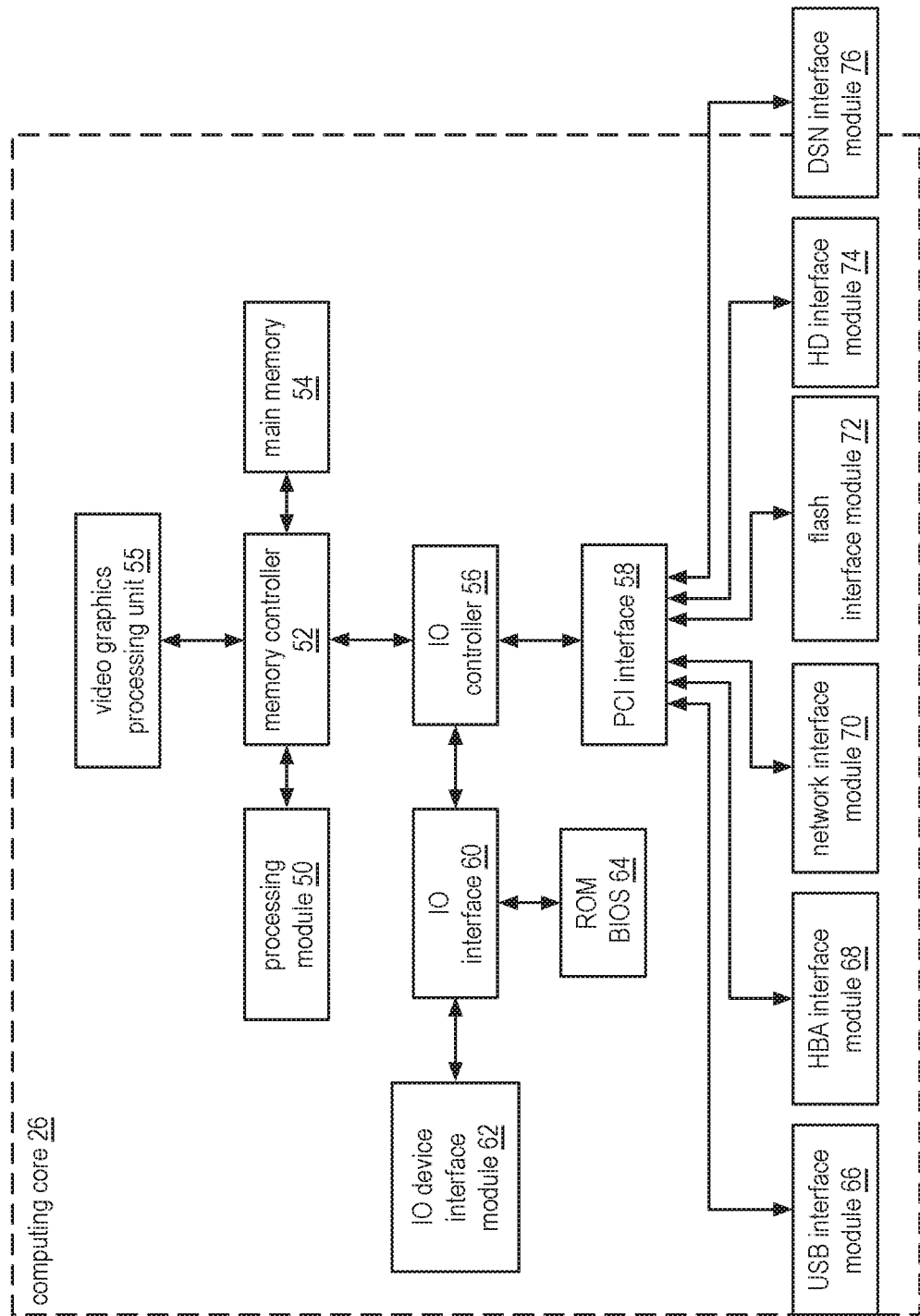
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
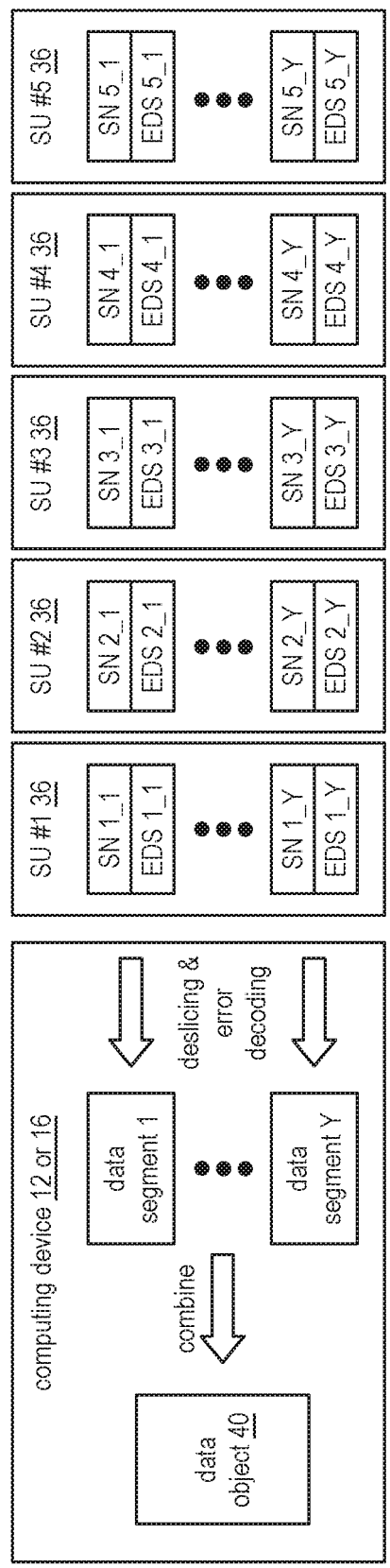
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
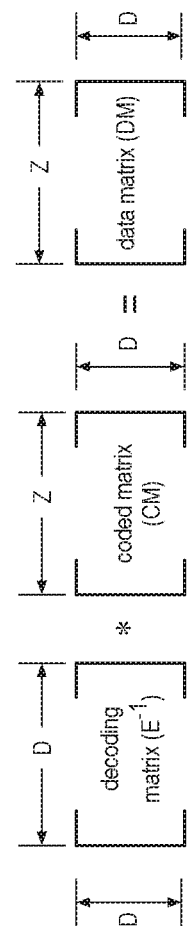
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
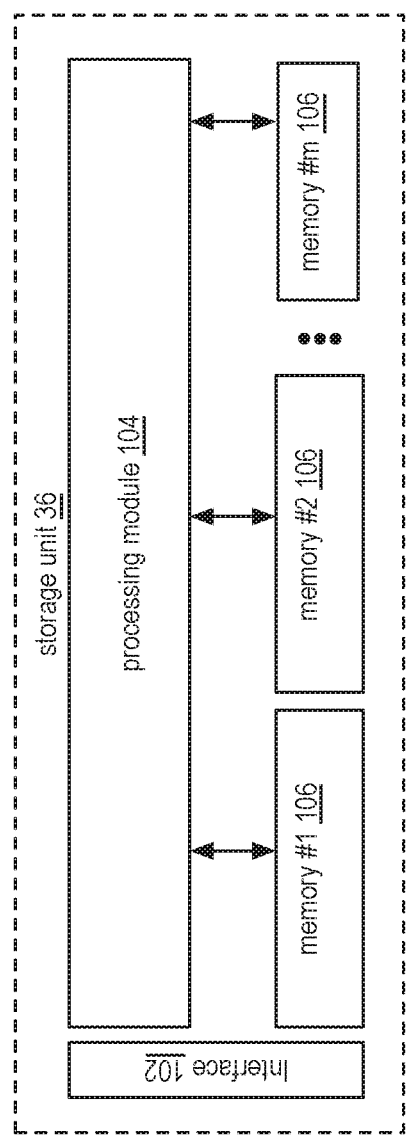
FIG. 9 is a schematic block diagram of an embodiment of a dispersed storage unit in accordance with the present invention.

FIG. 9 is a schematic block diagram of an embodiment of a dispersed storage unit (SU) 36 from FIG. 1. In this example SU 36 receives data traffic from the DSN via interface 102. SU 36 includes processing module 104, which manages traffic to and from memory devices 106 #1, #2 through # m. Memory devices 106 #1, #2 through # m can be located in the same geographic location, and/or the same physical enclosure, and can be connected over a local area network (LAN) or over a wide area network (WAN), such as network 24 from FIG. 1. SUs 36 A through X (sometimes called a "peer set") can be connected to other SUs in a storage pool, as illustrated the schematic block diagram of FIG. 10. Each of storage units 36 A through X are connected over network 24 to each other and to other DSN elements. As shown, network 24, which may include one or more wireless and/or wire lined communication systems, can be a WAN, a LAN or any other network structure that provides a conduit for communication with DSN network elements.

In an example embodiment, each of SUs 36 A through X in storage pool 108 are connected to administrator 110 via network 24. In another example SUs 36 A through X are configured with software (S/W) and/or hardware (H/W) for enabling SUs 36 A through X to execute a local leader election and execute one or more peer monitoring protocols. In an example SUs 36 A through X elect SU 36 A as a local leader for storage pool 108 and the remaining SUs in storage pool 108, acting, for example, to provide all or part of the functions that might be executed by managing unit 18 from FIG. 1. In practice the local leader SU may be a dynamic election/delegation, such that the local leader may change based on system needs and/or efficiency needs. Management information can be received by SU 36 A in response to a query by SU 36 A, in response to automated signaling by the remaining SUs in storage pool 108, in response to a notification by another network element or based on a predetermined protocol.

Figure 10:
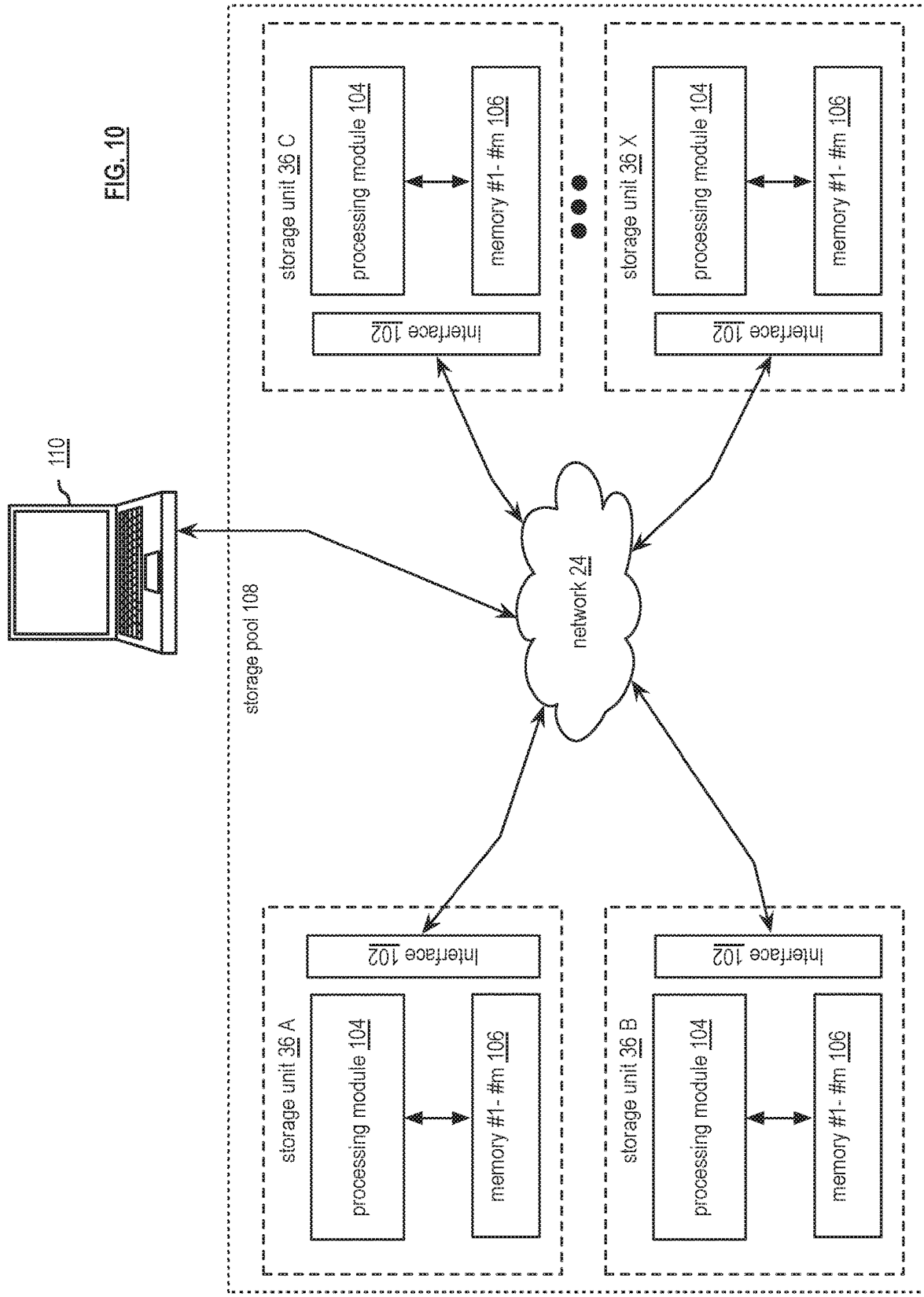
FIG. 10 is a schematic block diagram of an embodiment of a peer group of dispersed storage units in a storage pool in accordance with the present invention.

SUs 36 A through X are illustrated in FIG. 10 as being associated with storage pool 108. Alternatives to storage pool 108 can include, but are not limited to, one or more of storage pool sets and/or storage units located within the same physical site. As such, the local leader election and peer monitoring functions operate between the SUs 36 along natural and/or determined boundaries. Monitoring of the SUs, such as internal S/W and H/W health checks within the natural or determined boundaries, can be executed in whole or in part by each of the associated SUs. However, SUs cannot monitor their own health when they are powered down or otherwise compromised, accordingly the associated cannot determine the nature and effect of system network connectivity issues.

Use of a management unit, such as managing unit 18 from FIG. 1, can be used to assess the nature and effect of system network connectivity issues that individual SUs cannot determine, however the management unit cannot assess these issues when it is itself offline or otherwise compromised. In an example, SUs 36 A through X monitor their own health (or that of their peer SUs) and the local leader SU is responsible for transmitting a notification to an administrator or other DSN element. The election of a local leader to transmit and/or collect management information can effectively distribute the management unit functions to one or more SUs in peers associated with each other based on natural or determined boundaries. Notification to administrators can thereby be consolidated so that only one notification is required for the associated SUs. In one example the notification can be in the form of an electronic mail notification (email), an automated notification to a higher network layer of the DSN (which would then either transmit an automated notification to an even higher network layer or create an email notification itself) that is transmitted to one or more network administrators. In another example, administrators can be human operators and/or automated processing elements associated with the DSN.

When peer monitoring indicates that an SU is offline or compromised and a local leader SU has been determined the local leader is responsible for notifying the administrator of any local SU outages. In an example, the local leader determines that an SU is offline based on direct observations and/or observations collected from other SUs in the peer set. In another example, peer to peer communication can be used to initiate software upgrades as needed without losing system availability. In yet another example, peer to peer communications can be used to initiate rebuilding of one or more EDSs stored in a given SU, such as, for example, when SU health data collected by the local leader indicates that rebuilding is desirable, or when the local leader receives information regarding past and/or planned outages of SUs in the peer group. In these examples the local leader can manage S/W upgrades and/or rebuilding functions based on threshold requirements so as to ensure that system availability meets expectations.

An example SU includes an interface configured to interface and communicate with a DSN, a memory that stores operational instructions; and processing circuitry operably coupled to the interface and to the memory. The processing circuitry is configured to execute the operational instructions to coordinate with a plurality of dispersed storage units (SUs) that are affiliated with each other based on a predetermined arrangement that includes the SU and that are associated with the SU, to designate a leader SU among the plurality of SUs. Once a particular SU is designated the leader it is able to receive management information associated with the plurality of SUs from at least a subset of the other SUs and process the management information from those SUs of to determine whether at least one of the SUs of the plurality of SUs is offline, and based on a determination that the at least one of the SUs of the plurality of SUs is offline, transmit the management information for the plurality of SUs to one or more administrators associated with the DSN. In an example, based on the designation of another SU of the plurality of SUs being the leader, the example SU from above transmits, via the interface, management information that is associated with the SU to the another SU of the plurality of SUs that is designated the leader to be used by the another SU of the plurality of SUs that is designated the leader to determine whether the at least one of the SUs of the plurality of SUs is offline.

Figure 11:
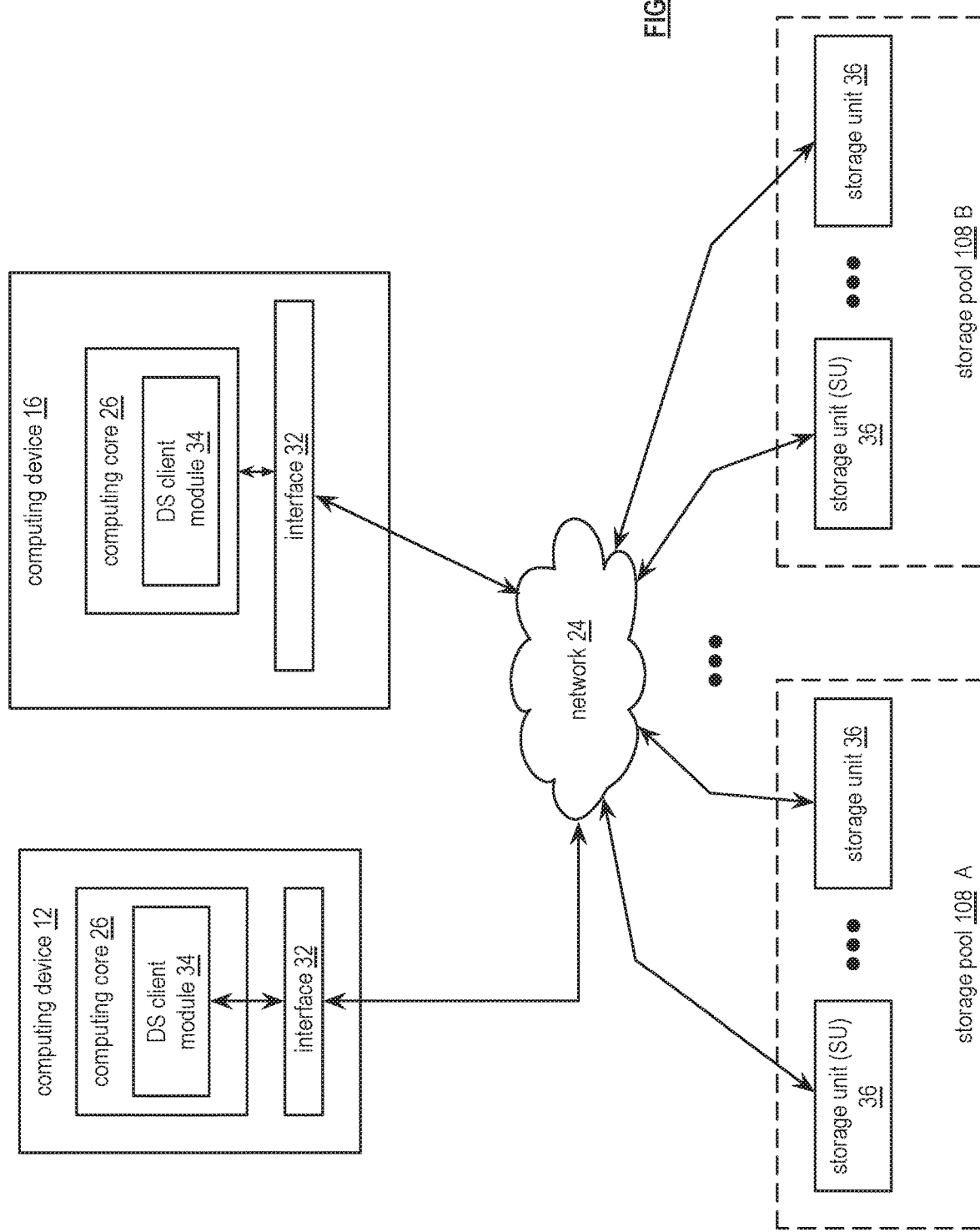
FIG. 11 is a schematic block diagram of an embodiment of a peer group of dispersed storage units in storage pool sets in accordance with the present invention.

FIG. 11 is a schematic block diagram of an embodiment of SUs 36 provisioned in storage pools in a DSN, such as illustrated FIG. 1. Storage pools 108 A and 108 B each include a plurality of storage units, where SUs within the storage pools can operate as peer groups within the storage pool. Alternatively, SUs in both storage pools 108 A and 108 B can be provisioned as a single peer group in a storage pool set, as described above with regard to FIG. 10. In an example, computing device 12 and or computing device 16 may be provisioned as administrators and receive notification from storage pools 108 A and 108 B, either separately or as a consolidated peer group.

Figure 12:
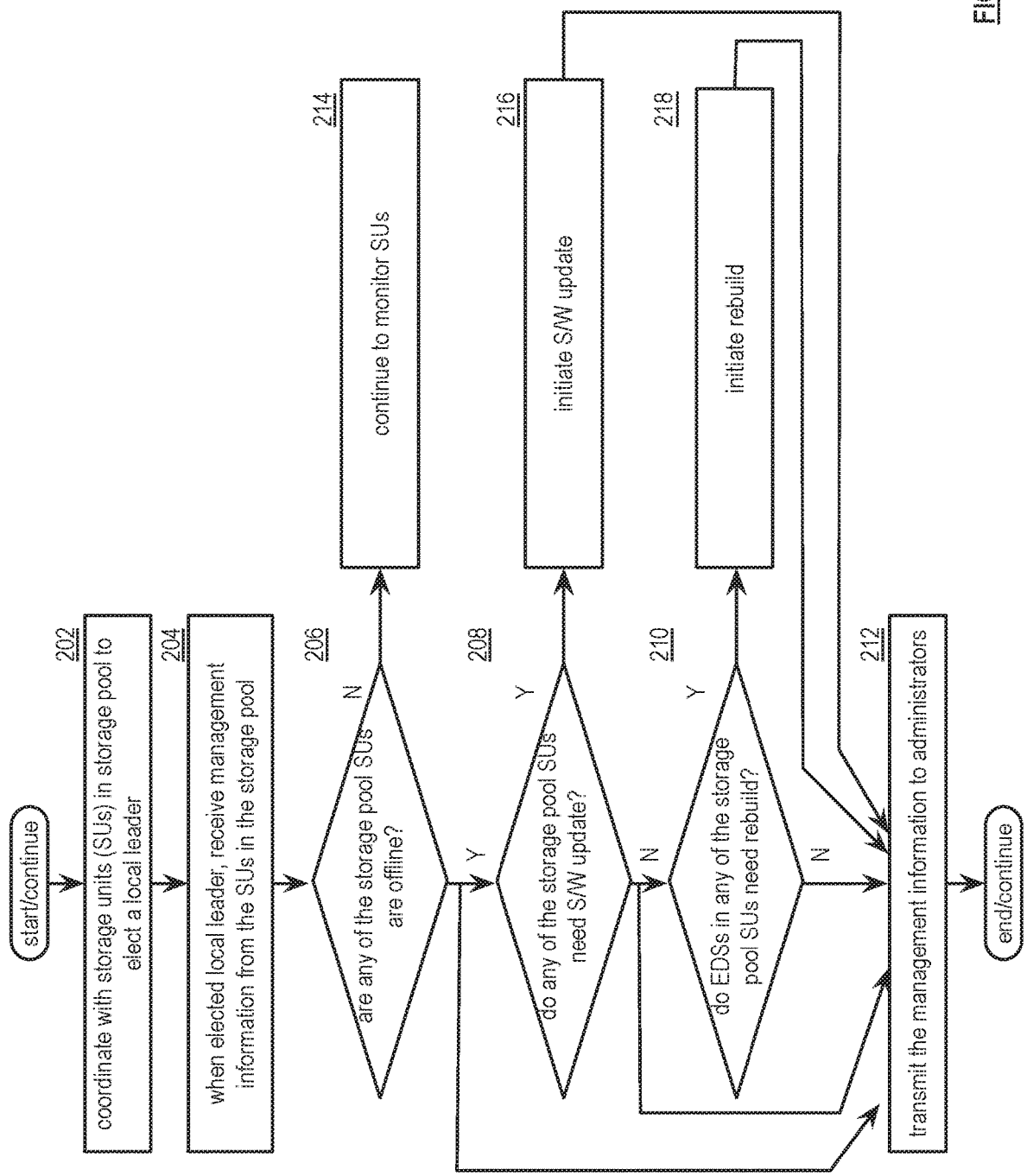
FIG. 12 is a flowchart illustrating an example of using peer to peer monitoring to collect and transmit management information in accordance with the present invention.

FIG. 12 is a flowchart illustrating an example of using peer to peer monitoring to collect and transmit management information in a DSN. In step 202 a peer group of SUs elect a local leader for the peer group SUs. In an example, the election function can be initiated by another DSN element, or by an SU in the peer group based on functionality provided for each of the peer group SUs. In step 204 a local leader is elected and the local leader collects management information from each of the SUs in the peer group that is online. The local leader then determines at step 206 whether any SUs in the peer group are offline and when one or more SUs are offline the local leader transmits a notification to one or more system administrators indicating that the one or more SUs are offline at step 212. When one or more SUs are offline, the local leader may, in one example, also determine in step 208 that one or more SUs in the peer group need updated S/W, and when S/W updating is needed, the local leader may initiate the update at step 216. In yet another example, the local leader may determine at step 210, based on collected management information, that EDSs in an offline SU or otherwise compromised SU should be rebuilt and at step 218 the local leader can initiate the rebuilding process for all or a portion of the affected EDSs.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A dispersed storage unit (SU) comprising:
an interface configured to interface and communicate with a dispersed or distributed storage network (DSN);
memory that stores operational instructions; and
processing circuitry operably coupled to the interface and to the memory, wherein the processing circuitry is configured to execute the operational instructions to:
coordinate with a plurality of dispersed storage units (SUs) that are affiliated with each other based on a predetermined arrangement that includes the SU and that are associated with the SU, to designate a leader SU among the plurality of SUs;
based on a designation of the SU being the leader:
receive, via the interface, management information that is associated with the plurality of SUs from at least some of the other SUs of the plurality of SUs;
process the management information from the at least some of the other SUs of the plurality of SUs to determine whether at least one of the SUs of the plurality of SUs is offline; and
based on a determination that the at least one of the SUs of the plurality of SUs is offline,
transmit the management information for the plurality of SUs to one or more administrators associated with the DSN.

2. The SU of claim 1, wherein the processing circuitry is further configured to execute the operational instructions to:
based on another designation of another SU of the plurality of SUs being the leader, transmit, via the interface, management information that is associated with the SU to the another SU of the plurality of SUs that is designated the leader to be used by the another SU of the plurality of SUs that is designated the leader to determine whether the at least one of the SUs of the plurality of SUs is offline.

3. The SU of claim 1, wherein the predetermined arrangement includes at least one of a storage pool, a storage pool set and a common dispersed storage site.

4. The SU of claim 1, wherein SU is adapted to coordinate with the plurality of SUs based on one or more predetermined protocols, and further wherein each SUs of the plurality of SUs is adapted to execute the one or more predetermined protocols.

5. The SU of claim 1, further comprising:
based on a determination that the at least one of the SUs of the plurality of SUs is offline, determine whether a software upgrade is desired for one or more SUs of the plurality of SUs, and
based on a determination to initiate a software upgrade is desired for one or more SUs of the plurality of SUs, initiate the software upgrade.

6. The SU of claim 1, further comprising:
based on a determination that the at least one of the SUs of the plurality of SUs is offline, determine whether a rebuild of one or more dispersed error encoded data slices is desired for one or more SUs of the plurality of SUs, and based on a determination that a rebuild of one or more dispersed error encoded data slices is desired for one or more SUs of the plurality of SUs, initiate a rebuilding process.

7. The SU of claim 6, wherein the rebuilding process is based on at least one of a previously authorized disk image and a previously authorized sequence of instructions that is interpreted by the processing circuitry of the SU.

8. The SU of claim 1, wherein the transmitting the management information for the plurality of SUs to one or more administrators associated with the DSN includes transmitting to one or more upper network layers.

9. The SU of claim 1, wherein the management information for the plurality of SUs is transmitted to using electronic mail.

10. A method for execution by a storage unit (SU), the method comprising:
coordinating with a plurality of dispersed storage units (SUs) that are affiliated with each other based on a predetermined arrangement that includes the SU and that are associated with the SU, to designate a leader SU among the plurality of SUs;
based on a designation of the SU being the leader:
receiving management information that is associated with the plurality of SUs from at least some of the other SUs of the plurality of SUs;
processing the management information from the at least some of the other SUs of the plurality of SUs to determine whether at least one of the SUs of the plurality of SUs is offline; and
based on a determination that the at least one of the SUs of the plurality of SUs is offline,
transmitting the management information for the plurality of SUs to one or more administrators.

11. The method of claim 10, further comprising:
based on another designation of another SU of the plurality of SUs being the leader, transmitting management information that is associated with the SU to the another SU of the plurality of SUs that is designated the leader to be used by the another SU of the plurality of SUs that is designated the leader to determine whether the at least one of the SUs of the plurality of SUs is offline.

12. The method of claim 10, wherein the predetermined arrangement includes at least one of a storage pool, a storage pool set and a common dispersed storage site.

13. The method of claim 10, wherein SU is adapted to coordinate with the plurality of SUs based on one or more predetermined protocols, and further wherein each SUs of the plurality of SUs is adapted to execute the one or more predetermined protocols.

14. The method of claim 10, further comprising:
based on a determination that the at least one of the SUs of the plurality of SUs is offline, determining whether a software upgrade is desired for one or more SUs of the plurality of SUs, and based on a determination to initiate a software upgrade is desired for one or more SUs of the plurality of SUs, initiating the software upgrade.

15. The method of claim 10, further comprising:
based on a determination that the at least one of the SUs of the plurality of SUs is offline, determining whether a rebuild of one or more dispersed error encoded data slices is desired for one or more SUs of the plurality of SUs, and based on a determination that a rebuilding of one or more dispersed error encoded data slices is desired for one or more SUs of the plurality of SUs, initiating a rebuilding process.

16. The method of claim 15, wherein the rebuilding process is based on at last one of a previously authorized disk image and a previously authorized sequence of instructions.

17. The method of claim 10, wherein the management information for the plurality of SUs is transmitted to the one or more administrators using electronic mail, and further wherein the electronic mail is created by the SU.

18. The method of claim 10, wherein at least one of the one or more administrators is adapted to execute one or more functions in response to the management information without immediate human intervention.

19. A method for execution by one or more processing modules of one or more dispersed storage units of a dispersed storage network (DSN), the method comprises:
coordinating with a plurality of dispersed storage units (SUs) that are affiliated with each other based on a predetermined arrangement that includes the SU and that are associated with the SU, to designate a leader SU among the plurality of SUs;
based on a designation of the SU being the leader:
receiving management information that is associated with the plurality of SUs from at least some of the other SUs of the plurality of SUs;
processing the management information from the at least some of the other SUs of the plurality of SUs to determine whether at least one of the SUs of the plurality of SUs is offline; and
based on a determination that the at least one of the SUs of the plurality of SUs is offline, transmitting the management information for the plurality of SUs to one or more administrators associated with the DSN.

20. The method of claim 19, further comprising:
based on a determination that the at least one of the SUs of the plurality of SUs is offline, determine whether a rebuild of one or more dispersed error encoded data slices is desired for one or more SUs of the plurality of SUs, and based on a determination that a rebuild of one or more dispersed error encoded data slices is desired for one or more SUs of the plurality of SUs, initiate a rebuilding process.

* * * * *